United States Patent
Giduturi

(10) Patent No.: US 11,205,480 B1
(45) Date of Patent: Dec. 21, 2021

(54) RAMP-BASED BIASING IN A MEMORY DEVICE

(71) Applicant: Micron Technology, Inc., Boise, ID (US)

(72) Inventor: Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/018,786

(22) Filed: Sep. 11, 2020

(51) Int. Cl.
  *G11C 13/00* (2006.01)
  *G11C 11/16* (2006.01)

(52) U.S. Cl.
  CPC ........ *G11C 13/003* (2013.01); *G11C 11/1653* (2013.01); *G11C 11/1659* (2013.01); *G11C 13/0023* (2013.01)

(58) Field of Classification Search
  None
  See application file for complete search history.

(56) References Cited

U.S. PATENT DOCUMENTS

| | | | | |
|---|---|---|---|---|
| 5,748,533 A | * | 5/1998 | Dunlap | G11C 11/5621 365/185.03 |
| 6,075,744 A | * | 6/2000 | Tsern | G11C 8/08 365/222 |
| 7,272,060 B1 | * | 9/2007 | Lu | G11C 7/12 365/189.09 |
| 9,466,369 B1 | * | 10/2016 | Pang | G11C 16/3427 |
| 9,640,273 B1 | * | 5/2017 | Chen | G11C 16/10 |
| 10,283,202 B1 | * | 5/2019 | Chen | G11C 11/5628 |
| 2002/0126550 A1 | * | 9/2002 | Sugio | G11C 7/16 365/200 |
| 2008/0298140 A1 | * | 12/2008 | Sutardja | G11C 11/4085 365/189.11 |
| 2012/0126783 A1 | * | 5/2012 | Jefremow | G11C 7/02 324/76.77 |
| 2014/0347951 A1 | * | 11/2014 | Kim | G11C 7/02 365/230.06 |
| 2018/0254087 A1 | * | 9/2018 | Yamaoka | G11C 16/10 |
| 2019/0108883 A1 | * | 4/2019 | Yu | G11C 7/14 |
| 2019/0333588 A1 | * | 10/2019 | Yang | G11C 16/3427 |

* cited by examiner

*Primary Examiner* — J. H. Hur
(74) *Attorney, Agent, or Firm* — Fletcher Yoder, P.C.

(57) ABSTRACT

Methods and systems include memory devices with multiple access lines arranged in an array to form a multiple intersections. Memory cells are located at the intersections of the multiple access lines. Decoders are configured to drive the multiple memory cells via the multiple access lines. Variable biasing circuitry may bias a voltage on an access line of the multiple access lines to change a variable ramp rate of the voltage on the access line. A control circuit is configured to determine a memory cell of the multiple memory cells to be activated. Based at least in part on a distance from the memory cell to a corresponding decoder, the control circuit may set the variable ramp rate of the biasing circuitry.

19 Claims, 7 Drawing Sheets

US 11,205,480 B1

RAMP-BASED BIASING IN A MEMORY DEVICE

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through drivers. The memory cells may be organized into one or more layers of memory cells, such as layers defined between overlapping wordlines and bitlines. These layers may be referred to as decks (e.g., memory decks). Various combinations of the wordlines, bitlines, and/or decoders may be referenced for use in a particular memory operation using addresses (e.g., memory addresses). The address may indicate which memory cell is to be selected using a combination of signals from the wordlines, bitlines, and/or decoders, and a particular value of the address may be based on ranges of addresses of the memory device. As may be appreciated, some memory cells at some intersections of the wordlines and bitlines may be farther from drivers than other memory cells at other intersections. To cause memory cells at various distances to be turned on from the respective decoders, the memory device may utilize one or more step voltages.

Due to the different electrical properties of paths between the different intersections and drivers, the memory cells may react differently. For instance, near memory cells that are nearer to the driver/decoders may have a lower voltage threshold and may experience much higher voltages than necessary to turn on due to the step voltage(s) causing large spike currents to rush through the memory cell based on capacitive discharge. Thus, the near memory cells may wear more quickly than far memory cells. Furthermore, with rapid voltage changes on lines and/or high voltages on the lines, adjacent wordlines and/or bitlines may be more susceptible to crossline coupling (e.g., capacitive coupling) that may increase risk of false selection of memory cells.

BRIEF DESCRIPTION OF THE DRAWINGS

Various aspects of this disclosure may better be understood upon reading the following detailed description and upon reference to the drawings in which.

DETAILED DESCRIPTION

Figure 1:
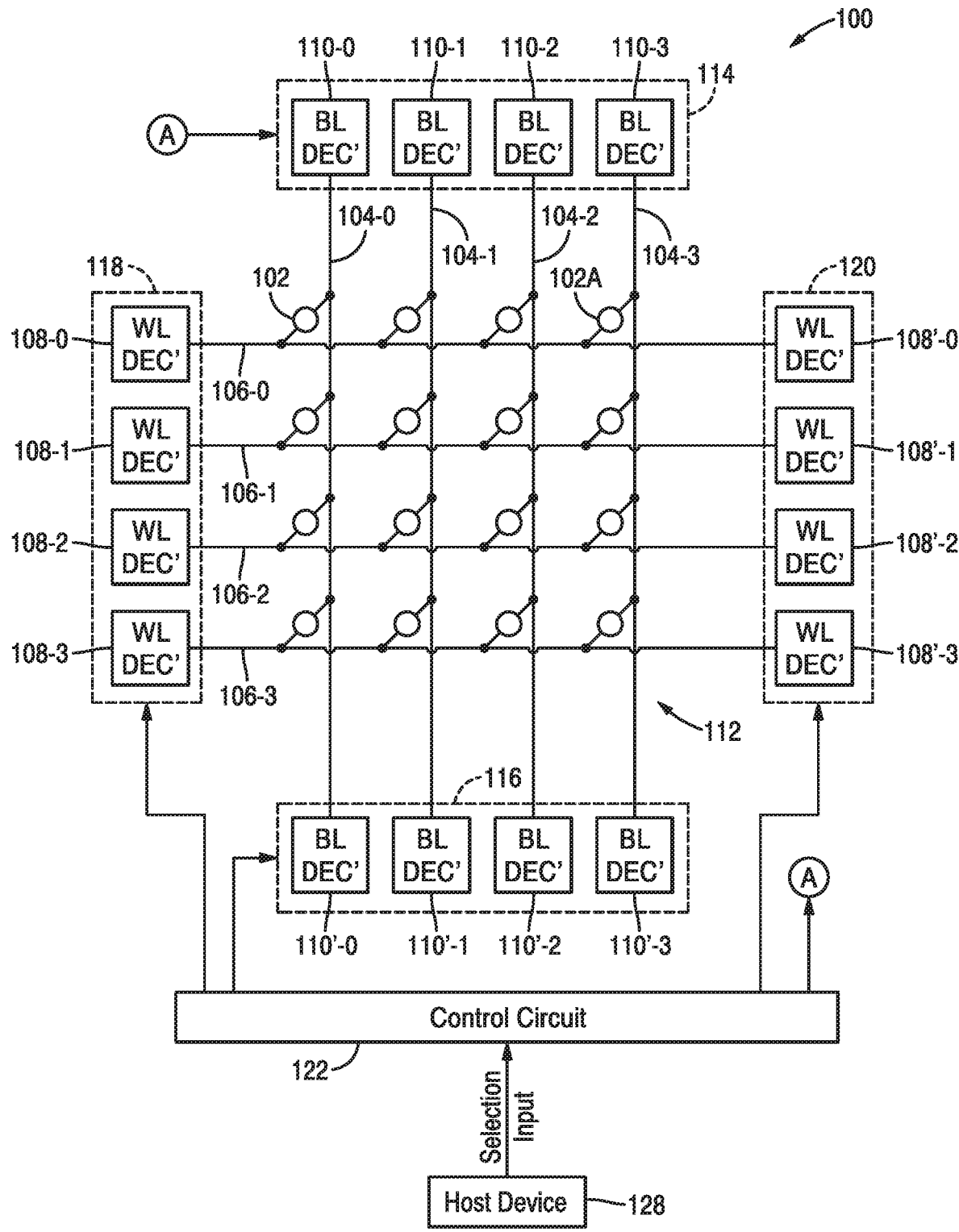
FIG. 1 is a simplified block diagram illustrating certain features of a memory device including a memory array of memory cells, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 0 decks, 1 deck, 2 decks, 4 decks, any number of decks) as different layers of the array.

Within a deck, a two-dimensional array of memory cells may be arranged at different intersections of the wordlines and the bitlines in the plane. Some of the intersections may be relatively close to the wordline drivers and/or the bitline drivers while others of the intersections may be relatively far from the wordline drivers and/or the bitline drivers. The transmission lines between the drivers and the intersections may differ. For example, the differences may be related to parasitic capacitances in the transmission lines and/or resistances in the transmission lines. These different lengths and electrical parameters are referred to herein as an electrical distance (ED). Due to the difference in transmission lines between the close intersections and the far intersections, the different intersections may receive voltage and/or current transmissions from the drivers at different levels and/or with different waveshapes. Accordingly, the drivers may set an output voltage that is sufficient to reach the far intersections at a level sufficient to cause the far memory cells to turn on. These closer memory cells using the higher voltage may experience a rush current spike far greater than the far memory cells experience. Accordingly, the close or near memory cells may wear more quickly than the far memory cells and/or may change electrical properties that slow response of the memory device.

To compensate for different needs of different memory cells at different EDs, the memory device may ramp biasing of voltages supplied to memory cells in a shape and/or with a slope that is tailored to the needs of the memory cell. For example, the ED of each memory cell may be based on a distance from a wordline driver and/or a bitline driver used to drive the memory cell. Memory cells that are below a threshold distance from the wordline driver and/or the bitline driver may be driven using a slope to ramp the voltage and/or maximum voltage while far memory cells may use a different slope and/or maximum voltage. Furthermore, the memory device may include snap detection to stop ramping a voltage upon detection that the memory cell has snapped (i.e., begun conducting current through the memory cell).

Keeping the foregoing introduction in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102. Furthermore, the memory device 100 may include other circuitry, such as a biasing circuitry configured to bias the bitlines 104 or wordlines 106 in a corresponding direction. For example, the bitlines 104 may be biased with positive biasing circuitry while the wordlines 106 may be biased with negative biasing circuitry.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide biased electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity biasing to the memory cells 102 (e.g., in particular, writing to selector device (SD) material of the memory cell) and reading the memory cells 102 (e.g., in particular, reading a voltage stored by the SD material of the memory cell 102) using a signal with a given (e.g., known) fixed polarity. In some embodiments, a selection input may be received from a host device 128, such as a host processor reading data from the memory device 100 to cause the control circuit 122 to access particular memory cells 102.

Figure 2:
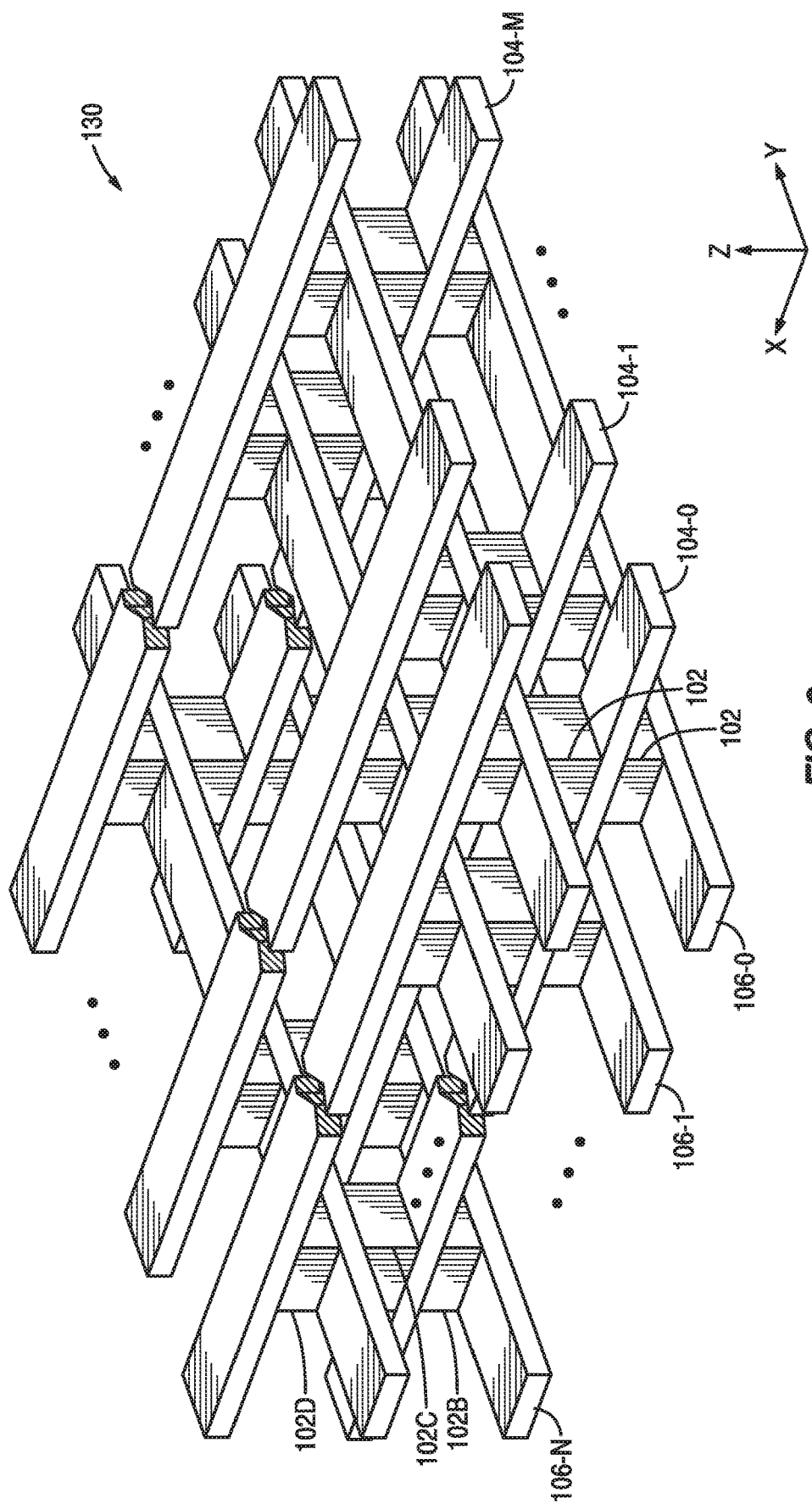
FIG. 2 is a side-view of a diagram illustrating the portion of the memory array of FIG. 1, according to an embodiment of the present disclosure.

FIG. 2 is a diagram illustrating a portion of a memory array 130 in accordance with an embodiment of the present disclosure. Inside the memory array 130, the memory cells are located at intersections of orthogonal lines. The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular wordline 106 and the bitline 104 combination serving as the electrodes for the memory cell 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104/one or more wordlines 106 corresponding to the respective memory cells 102 in response to a particular voltage applied to the selected of the bitlines 104/wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or fewer bitlines 104, wordlines 106, and/or memory cells 102 than shown in the examples of FIG. 2. Each deck may include one or more memory cells 102 aligned in a same plane.

Figure 3:
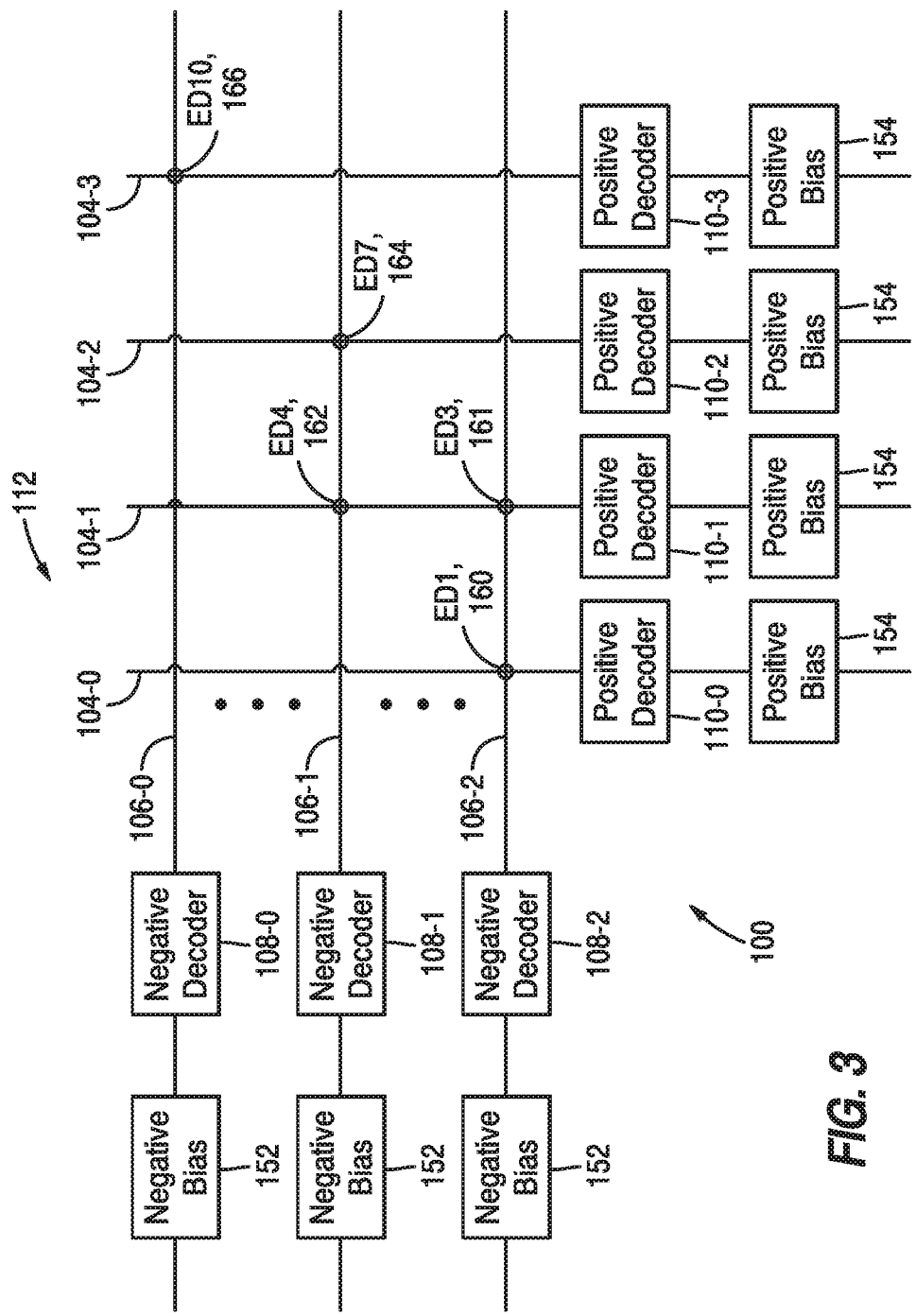
FIG. 3 is a simplified circuit diagram of the memory array of FIG. 1, according to an embodiment of the present disclosure.

FIG. 3 is a simplified diagram of a deck of a memory device 150 that may be included in an embodiment of the memory device 100. As previously discussed, at the intersections of the bitlines 104 and the wordlines 106 in the memory array 112, the memory cells 102 may be used to store information. However, the memory cells 102 have been omitted from FIG. 3 for simplicity. Each bitline 104 is driven by a respective bitline decoder 110, and each wordline 106 is driven by a respective wordline decoder 108.

As illustrated, the bitline decoder 110 and the wordline decoder 108 may have polarities to cause the respective bitlines 104 and wordlines 106 to be driven to different levels to cause a voltage drop across the memory cell 102. Although the following discusses positive and negative polarities, the positive polarity may include a more positive voltage while the negative polarity has a more negative voltage. For instance, the more positive voltage may include a positive voltage relative to ground and the more negative voltage may include a negative voltage relative to ground. Alternatively, both the more positive voltage and more negative voltage may have a same polarity (e.g., positive) with different values (e.g., 6V and 1V, respectively).

Furthermore, although the bitlines 104 may be illustrated as having a more positive voltage while the wordlines 106 have a more negative voltage, the polarities of the bitlines 104 and wordlines 106 may be switched along with corresponding driving and biasing circuitry. The bitlines 104 may be biased to the more positive voltage using positive biasing circuitry 154 while the wordlines 106 may be biased to the more negative voltage using negative biasing circuitry 152. Furthermore, although each bitline 104 is shown having a corresponding positive biasing circuitry 154 and each wordline 106 is shown having a corresponding negative biasing circuitry 152, some embodiments of the memory device 100 may include one or more bitlines 104 sharing a common positive biasing circuitry 154 and/or one or more wordlines 106 sharing a common negative biasing circuitry 152. Indeed, in some embodiments, one biasing circuitry may be used to drive one or more bitlines 104 and one or more wordlines 106 sequentially or simultaneously.

As may be appreciated, the memory array 112 may include various different intersections with different electrical properties, such as resistances and/or parasitic capacitances at the different intersections. Based at least in part on the parasitic capacitance and/or resistance in the memory array 112, different intersections have a different electrical distance (ED) that causes different voltages and/or currents to be seen at different memory cells 102. In other words, voltages and/or currents seen at intersections 160, 161, 162, 164, and 166 may differ from each other even when the respective wordlines 106 and bitlines 104 are driven to the same value. Particularly, the intersection 160 may have less resistance (and parasitic capacitance) between the intersection 160 and the wordline decoder 108-2 than the intersection 161 has between the intersection 161 and the wordline decoder 108-2. Thus, if the same voltages were to be used to drive intersections from the wordline decoder 108-2, the different intersections may respond differently. For instance, the intersection 160 may experience more rush current when the corresponding memory cell 102 (FIG. 1) turns on than the intersection 161 may experience due to the excess voltage creating causing additional charge to be stored on the line via line capacitance that is discharged when the memory cell 102 is turned on.

Figure 4:
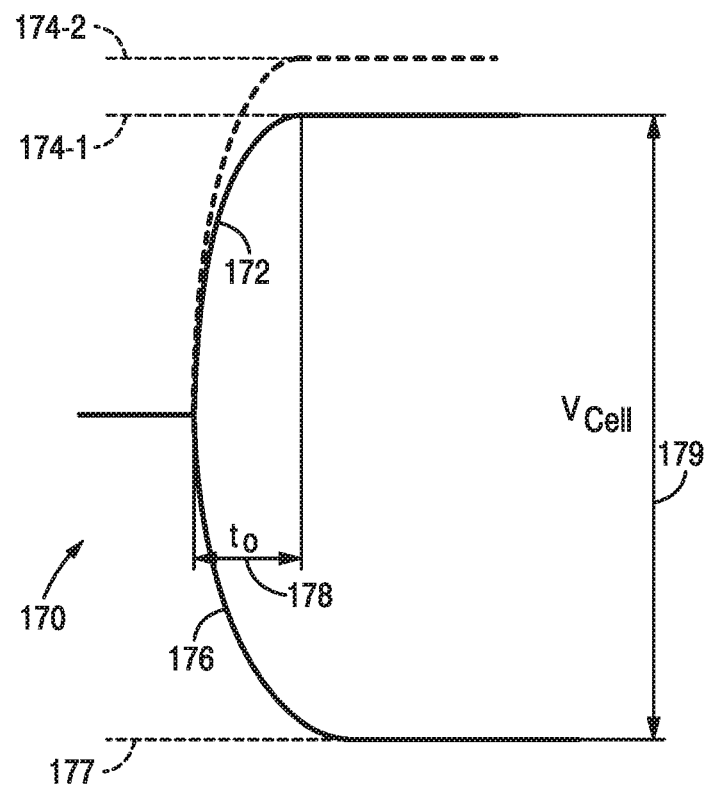
FIG. 4 is a graph of electrical voltages using a single step or square wave for each voltage applied to a memory cell of the memory array of FIG. 1, according to an embodiment of the present disclosure.

FIG. 4 is a graph 170 of a voltage 172 on a bitline 104 and wordline 106 for a particular memory cell 102. As illustrated, when the memory cell 102 is to be turned on, the voltage 172 increases to a more positive voltage level 174 via the positive biasing in the positive biasing circuitry 154 for a location of the memory cell 102. In some embodiments, different voltage levels 174 may be appropriate for activation of different memory cells 102. For instance, a lower voltage level 174-1 may be appropriate for activating some memory cells 102 (e.g., near memory cells 102 nearer to the bitline decoder 110) while a higher voltage level 174-2 may be appropriate for driving other memory cells 102 (e.g., far memory cells 102 further from the bitline decoder 110). A corresponding voltage 176 may be applied to the memory cell 102 via the respective wordline 106 at the intersection (e.g., intersection 160) of the memory cell 102 when the memory cell 102 is to be turned on. For instance, the wordline 106 may be biased to a more negative voltage 177 when the bitline 104 applies a corresponding more positive voltage level 174. Furthermore, while only multiple appropriate voltages are discussed in relation to the bitlines 104, similar appropriate voltage levels may be useful for the wordlines 106.

As illustrated, the voltage levels 174 and 177 may be achieved using one or more voltage steps, square waves, and/or other shapes. In actual application, the ramp from an initial voltage to the respective voltage levels 174 and 177 may be slower than instantaneous. The period of time over which this ramp occurs may be referred to as ramp time 178. The length of the ramp time 178 may be controlled by electrical properties of the bitline 104, the wordline 106, and the respective decoders. For instance, the ramp time 178 may be related to the resistance and capacitance of the bitline 104, the wordline 106, and the respective decoders. Accordingly, the ramp time 178 may be static for each intersection based on the underlying technology used to implement the memory device 100. The voltage level 174 (e.g., maximum voltage level) may be dictated by a highest threshold voltage on the for the memory cells 102 coupled to the bitline 104 (e.g., far memory cells 102 at intersection 166). Near memory cells 102 (e.g., at intersection 160) may experience much faster ramp rates when compared to the far memory cells 102 due to lower resistances and capacitances. Furthermore, near memory cells 102 may experience much higher voltages the necessary causing larger currents to flow through the near memory cells 102 when activated than flows through the far memory cells 102 when activated. Specifically, the near memory cells 102, when activated, may experience relatively high current spikes due to capacitive discharge through the near memory cells 102. Additionally, higher voltages (e.g., voltage level 174-2) with faster ramp rates on the bitlines 104 and/or the wordlines 106 may increase the likelihood of the bitline 104 and/or the wordline 106 coupling to adjacent bitlines 104 or wordlines 106 potentially inhibiting operation of the memory device 100. Although the foregoing discusses different voltage levels for the voltage 172 of the bitline 104, similar differentiation of appropriate voltage levels may be applicable to the voltage 176 of the wordline 106 to reach a desired cell voltage 179. In some embodiments, the cell voltage 179 is set to satisfy a highest threshold to turn on the far memory cells 102.

Figure 5:
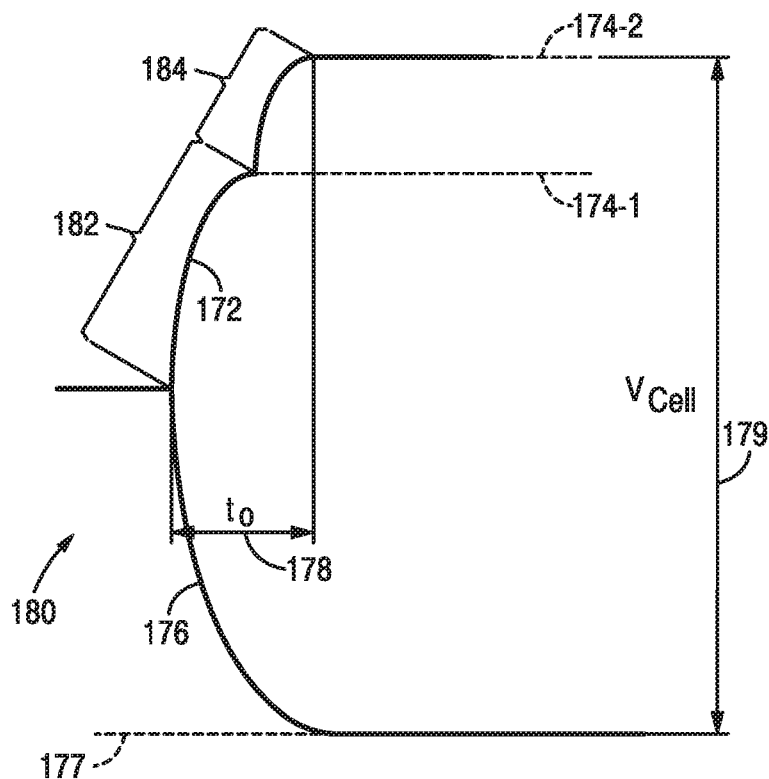
FIG. 5 is a graph of electrical voltages using multiple steps to increase voltage across a memory cell of the memory array of FIG. 1, according to an embodiment of the present disclosure.

FIG. 5 is a graph 180 that is similar to the graph 170 of FIG. 4. In contrast to the graph 170, in the graph 180, the voltage 172 is formed using a first step 182 to the voltage level 174-1 and a second step 184 to the voltage level 174-2. However, this voltage step scheme may have some of the same issues discussed in relation to FIG. 4 even if some issues may be less severe using the step voltage technique.

Instead of square waves or voltage steps, the memory device 100 may utilize ramping circuitry to create a more gradual slope. Specifically, the negative biasing circuitry 152 and/or the positive biasing circuitry 154 may be used to change the ramp rate and resulting ramp time 178 based on a distance from the corresponding decoder. Specifically, the ramp time 178 may be tuned by the control circuit 122 to match the net resistance/capacitance values for the corresponding intersections. Using such tuning, the control circuit 122 may be used to cause each memory cell 102 to see similar ramp times regardless of ED. For example, the control circuit 122 may be used to set a ramp time 178 of near memory cells 102 to be equal to a ramp time 178 of far memory cells 102.

Figure 6:
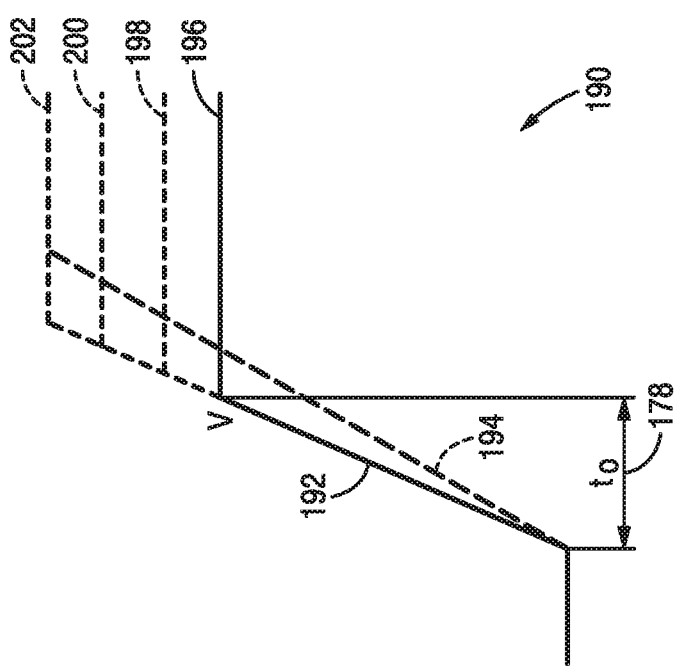
FIG. 6 is a graph of electrical voltages using a ramp to increase a voltage applied to a memory cell of the memory array of FIG. 1, according to an embodiment of the present disclosure.

FIG. 6 is a graph 190 of a dynamic ramp-based signal used to apply a voltage via the bitlines 104 or the wordlines 106. As illustrated, the slope of voltages 192 and 194 may be dynamically set to control the duration of the ramp time 178. Although two different slopes are shown, the number of selectable slopes/waveshapes may vary according to design choice regarding implementation. Regardless, a slower ramp rate may be used to lengthen the ramp time 178 from a minimum value. Although the turning on of a particular memory cell 102 may be delayed beyond the minimum duration for the ramp time 178, the slower ramp rate may provide one or more benefits that make the tradeoff acceptable. For instance, a slower ramp rate may cause adjacent bitlines 104 and/or wordlines 106 to be less prone to cross-coupling thereby potentially reducing false selections of memory cells 102. Furthermore, a slower ramp rate may reduce the magnitude of spike currents when the memory cell 102 switches on thereby increasing reliability of the memory cells 102, especially the near memory cells 102.

As may be appreciated the ramp rate may be tuned by the control circuit 122 based on the needs of the memory cells 102 rather than being static based on the underlying technology used to construct the memory array 130. This dynamic adjustment by the control circuit 122 may be based at least in part on a position of the memory cell 102. Furthermore, using the dynamic ramp rate, a maximum value of the ramped voltage, such as voltage levels 196, 198, 200, and 202, may be selected to reduce the likelihood of too much voltage being applied to the various intersections of the memory array 130. For example, snap detection may be performed on the ramped voltage and/or time of ramping may be used to enable clamping to one of the voltage levels 196, 198, 200, and 202. Using such clamping techniques, the maximum voltage for a particular memory cell 102 may be dynamically based on the position of the memory cell 102, ensuring that far memory cells 102 receive sufficient voltage without providing too much voltage to near memory cells 102 that may cause the near memory cells 102 to be subjected to relatively high spike currents.

Figure 7:
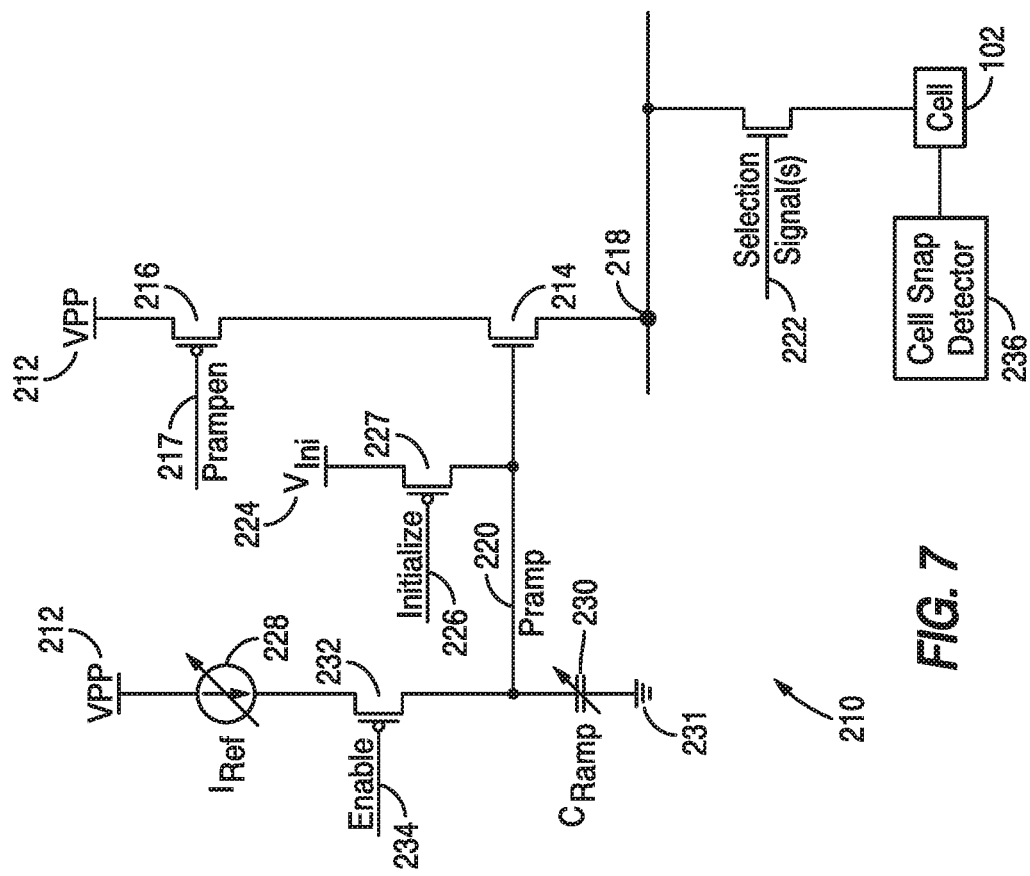
FIG. 7 is a schematic diagram of biasing circuitry used to generate the ramp of FIG. 6, according to an embodiment of the present disclosure.

FIG. 7 is a circuit diagram of an embodiment of biasing circuitry 210 that may be implemented in the positive biasing circuitry 154 and/or the negative biasing circuitry 152. The direction of the bias is set using a magnitude and direction of a supply voltage 212 and the direction of the variable current source 228. The supply voltage 212 may be fixed for a specific mode of operation for the memory device 100. The supply voltage 212 is used to selectively bias the memory cell 102 via a bias transistor 214. The bias transistor 214, when activated, may cause supply charge from the supply voltage 212 to modify ramping biasing to the memory cell 102 via a node 218. In some embodiments, the biasing circuitry 210 may include an enable transistor 216 that cuts off biasing of the transmissions to the memory cell 102 via the node 218 unless a ramp enable signal 217 enables the ramping biasing. To control the slope of the ramp, a voltage, a number of pulses, and the like may be applied using a ramp signal 220 to control transmission of the supply voltage 212 to the node 218. Specifically, the ramp signal 220 may be applied to a gate of the bias transistor 214. The voltage at the node 218 (e.g., in a bitline 204 or wordline 206) may be transmitted to a respective memory cell 102 based at least in part on selection signal(s) 222 configured to select the particular memory cell 102.

An initialize voltage 224 may be used control an initial or default amount of biasing to be applied via the node 218. An initialize voltage 224 is added to the ramp signal 220 using an initialize signal 226 that applies the initialize voltage 224 via an initialization transistor 227.

Since the slopes of the ramps of the ramping biasing may be selectable, variable inputs may be used to control the slope or ramp rate via the ramp signal 220. For instance, the biasing circuitry 210 may include a variable current source 228 and/or a variable capacitor 230. The variable current source 228 may be controlled using a trim input (e.g., 5 bits) controlling the amount of current output from the variable current source 228. For instance, the trim input for the variable current source 228 may be set by and/or received from the control circuit 122 that may be calculated dynamically, determined using a lookup table, or any other suitable mechanism for setting the trim based on a location/address of a memory cell 102 being accessed. Similarly, the variable capacitor 230 may control the capacitance between the ramp signal 220 and ground 231 (or another common return). The variable capacitor 230 may be controlled using a trim input (e.g., 5 bits) controlling the amount of capacitance of the variable capacitor 230. For instance, the trim input for the variable capacitor 230 may be set by and/or received from the control circuit 122.

A transistor 232 may be used to control whether to apply and how long to apply the current from the variable current source 228 to the ramp signal 220 using a respective enable signal 234. The amount of charge transmitted into the ramp signal 220 and, consequently, the node 218 may control the slope of the ramping during biasing. The amount of charge being transmitted may be controlled by: 1) changing a duration of enablement of the transmission of charge by changing the duration of assertion of the enable signal 234; 2) changing the amount of current flowing into the ramp signal 220 by changing the output of the variable current source 228; and/or 3) changing the amount of capacitance in the variable capacitor 230. The control circuit 122 may store different settings for different memory cells 102 and may use the corresponding settings for corresponding memory cells 102.

Furthermore, the biasing circuitry 210 may be used to cutoff the biasing once the memory cell 102 has snapped or begins passing current through the memory cell 102. A snap detector 236 may be used to determine whether the memory cell 102 has snapped. For instance, the snap detector 236 may include a current sensor configured to detect whether a current is flowing into, out of, and/or through the memory cell 102. Upon detection of a snap of the memory cell 102, via the snap detector 236, the control circuit 122 may de-assert the enable signal 234 and/or the ramp enable signal 217 to cease ramping of the voltage of the node 218.

Figure 8:
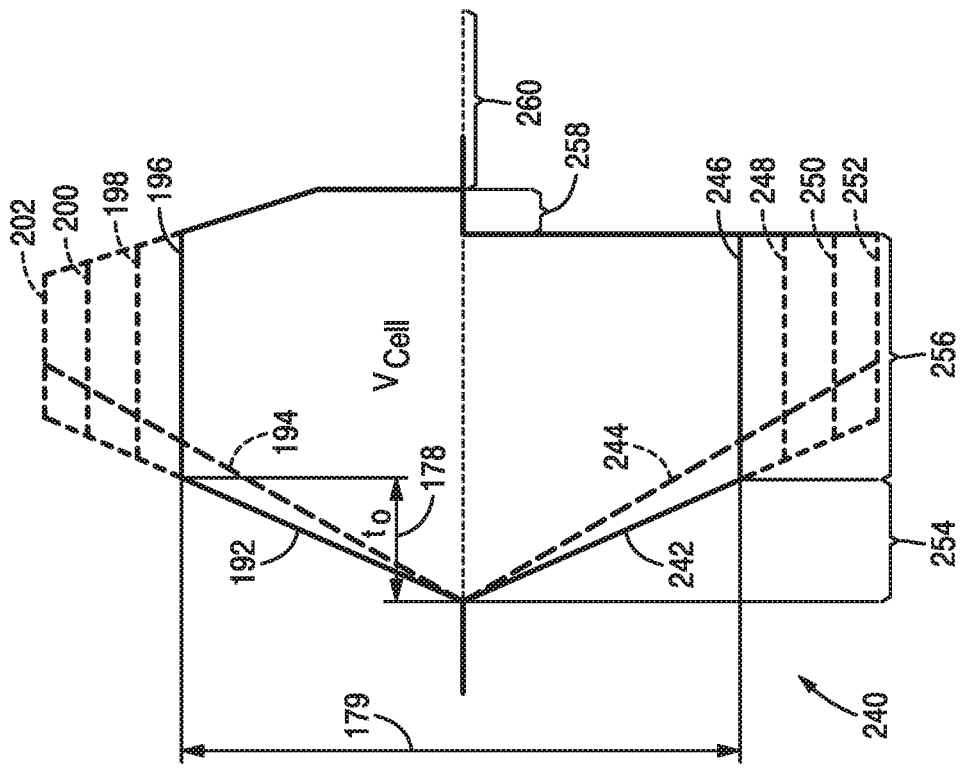
FIG. 8 is a graph of electrical voltages using a ramp up to increase a first voltage applied to a memory cell of the memory array of FIG. 1 and a ramp down to decrease a second voltage applied to the memory cell, according to an embodiment of the present disclosure.

Although the foregoing discussion primarily relates to ramping up a positive voltage with additional charge, a ramp down scheme may be used to ramp down a voltage of the memory cell. For instance, FIG. 8 is a graph 240 of a dynamic ramp-based signal used to apply a voltage via the bitlines 104 or the wordlines 106. As illustrated, the slope of voltages 192, 194, 242, and 244 may be dynamically set to control the duration of the ramp time 178. Although two different slopes are shown for respective positive and negative ramps, the number of selectable slopes/waveshapes may vary according to design choice regarding implementation (e.g., finer tuning using the variable current source 228 and/or the variable capacitor 230). Regardless, a slower ramp rate may be used to lengthen the ramp time 178 from a minimum value. As previously noted, a slower ramp rate may cause adjacent bitlines 104 and/or wordlines 106 to be less prone to cross-coupling thereby potentially reducing false selections of memory cells 102. Furthermore, a slower ramp rate may reduce the magnitude of spike current when the memory cell 102 switches on thereby increasing reliability of the memory cells 102, especially the near memory cells 102.

As previously noted, the ramp rate may be tuned by the control circuit 122 based on the needs of the memory cells 102 rather than being static based on the underlying technology used to construct the memory array 130. This dynamic adjustment by the control circuit 122 may be based at least in part on a position of the memory cell 102. Furthermore, using the dynamic ramp rate, the control circuit 122 may select a maximum value of the ramped voltage, such as voltage levels 196, 198, 200, and 202 to reduce the likelihood that too much voltage is applied across the memory cell 102. Similarly, using the dynamic ramp rate, the control circuit 122 may select a minimum value of the ramped voltage, such as voltage levels 246, 248, 250, and 252 to reduce the likelihood that too much voltage is applied across the memory cell 102.

As previously discussed, snap detection, using the snap detector 236, may be performed on the ramped voltages and/or time of ramping to enable clamping to the voltage levels 196, 198, 200, and/or 202 and to the voltage levels 246, 248, 250, and/or 252. Using such clamping techniques, the maximum voltage for a particular memory cell 102 may be dynamically based on the position of the memory cell 102 ensuring that far memory cells 102 receive sufficient voltage without providing too much voltage to near memory cells 102 that may cause the near memory cells 102 to be subjected to relatively high spike currents.

Furthermore, different segments of ramping up or ramping down may have different ramp rates. For instance, during a first segment 254, a voltage 192 may be used with a first ramp rate while voltage 242 is used with a second ramp rate. In some embodiments, the first and second ramp rates may have the same magnitude but in different directions. Alternatively, the first and second ramp rates may have different magnitudes. In a second segment 256, consistent voltage levels may be used for both positive and negative biases. However, in a third segment 258, a ramp down is used for the positive voltage while a step voltage drop may be used for the negative voltage. In a fourth segment 260, both positive and negative voltages have returned to an initial value. As illustrated, the positive voltage may have a ramp down (e.g., default slope) that is terminated at the end of the third segment 258.

Figure 9:
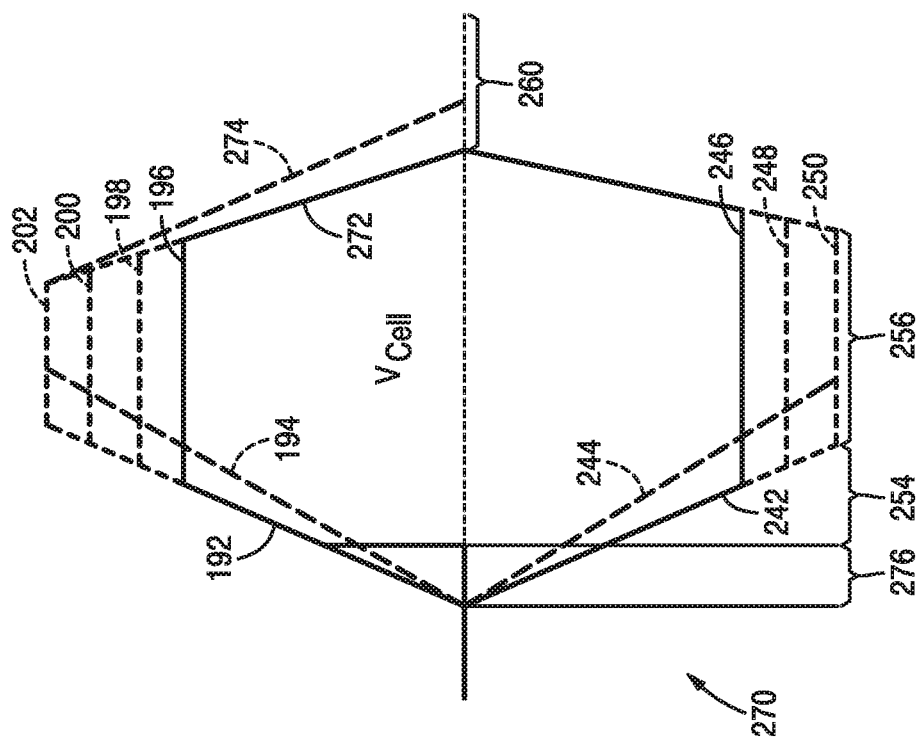
FIG. 9 is a graph of electrical voltages using a ramp up to increase a first voltage applied to a memory cell of the memory array of FIG. 1, a ramp down to decrease a second voltage applied to the memory cell, and a ramp down to decrease the first voltage, according to an embodiment of the present disclosure.

Although the foregoing discusses variable ramp up rates for a positive voltage and variable ramp down rates for a negative voltage, a graceful shutdown of the memory cell 102 without risking re-snapping of the memory cell 102 may be performed by using variable ramping down of the positive voltage and/or variable ramping up of the negative voltage. For instance, FIG. 9 is a graph 270 of a dynamic ramp-based signal used to apply a voltage via the bitlines 104 or the wordlines 106. The graph 270 is similar to the graph 240 except that the positive voltage has a variable ramp down shown as voltages 272 and 274. Although only two slopes are shown as possible ramp down of ramp rates of the positive voltage, any number of ramp down rates may be selectable using biasing circuitry. The graph 270 also differs from the graph 240 in that a first part 276 of the ramp positive voltage during a first segment may increase using a step up in a substantially square shape for a portion of the maximum voltage before ramping up using a more gradual slope for the rest of the voltage increase in the first segment 254.

Figure 10:
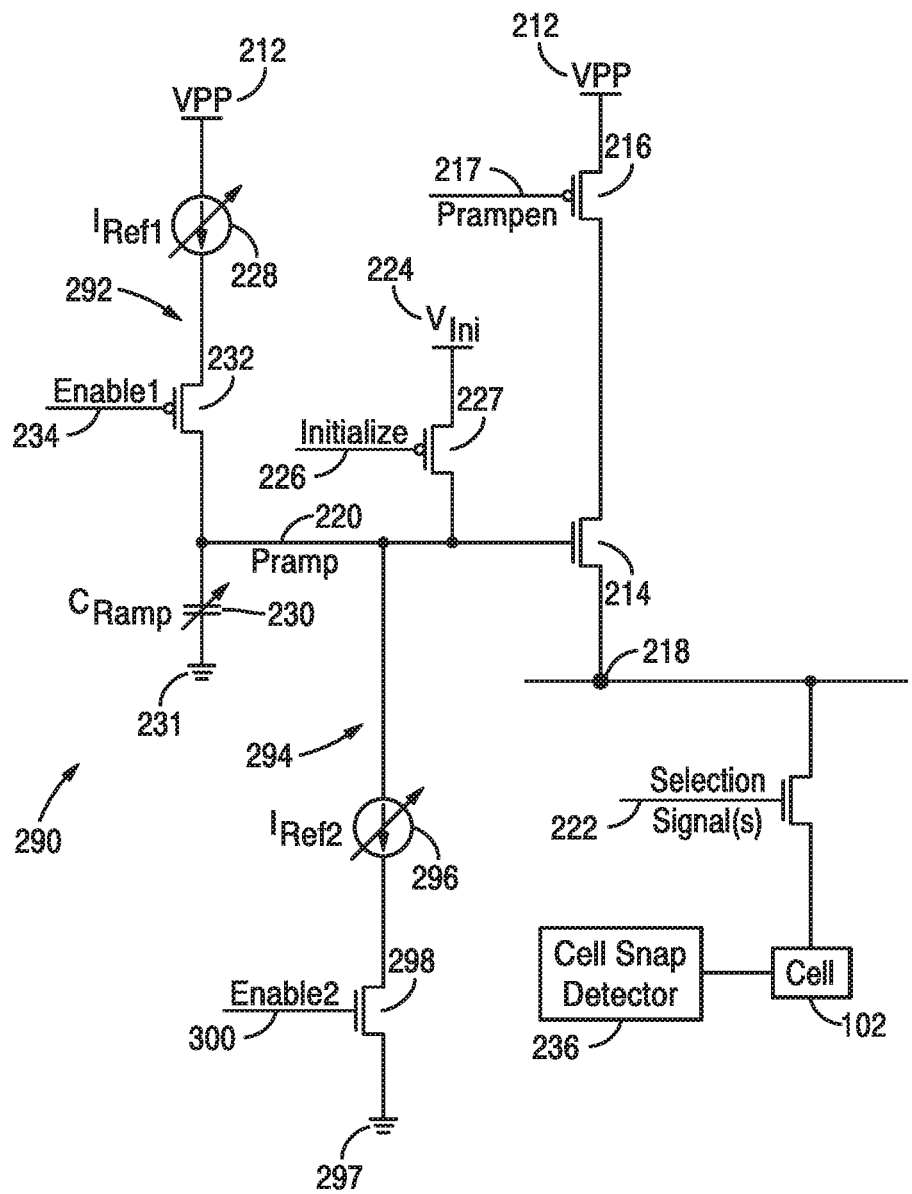
FIG. 10 is a schematic diagram of a biasing circuitry used to generate the ramp up or ramp downs, such as those shown in FIGS. 8 and 9, according to an embodiment of the present disclosure.

FIG. 10 is a schematic diagram of biasing circuitry 290. The biasing circuitry 290 may function similar to the biasing circuitry 210 except that the biasing circuitry 290 is configured to selectively provide a ramp up and ramp down for biasing rather than only a single direction for ramp biasing. Specifically, the biasing circuitry 290 includes a ramp up leg 292 and a ramp down leg 294. The ramp up leg 292 includes the variable current source 228, the transistor 232, and the variable capacitor 230 that function identical to their counterparts in the biasing circuitry 210. However, in addition to ramp up (or single direction ramp down) functionality, the biasing circuitry 290 provides a ramp down functionality via the ramp down leg 294. As illustrated, the ramp down leg 294 includes a variable current source 296 coupled to the ramp signal 220 and configured to draw charge from the ramp signal 220 to ground 297 (or another common return). The variable current source 296 may receive an input (e.g., 5 bits) that trims the current to a particular value. Indeed, the variable current source 296 may function similar to the variable current source 228 of the biasing circuitry 210 except that the variable current source 296 draws charge away from the ramp signal 220 rather than adds charge to it. Between the variable current source 296 and the ground 297, the biasing circuitry 290 includes a transistor 298. The transistor 298 controls whether the variable current source 296 is able to draw charge from ramp signal 220 based on whether a ramp down enable signal 300 is asserted at a gate of the transistor 298. As may be appreciated, a slope of the ramp down may be based at least in part on the current set for the variable current source 296, the duration of assertion of the ramp down enable signal 300, and/or the variable capacitance of the variable capacitor 230. The settings for these components may be stored in the memory device 10 for use by the control circuit 122 to control operation of the driving of the bitlines 104 and/or the wordlines 106 to reduce inadvertent activations of memory cells 102, reduce uneven wearing of the memory cells 102, reduce re-snapping of memory cells 102, reduce voltage overshoots, increase timing consistency between memory cells 102 at different locations, and/or resolve other issues regarding biasing and snapping the memory cells 102.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a plurality of access lines arranged in a grid;
a plurality of memory cells located at intersections of the access lines in the grid;
a plurality of drivers, each configured to transmit a voltage along a respective access line to a respective memory cell of the plurality of memory cells; and
biasing circuitry configured to bias the voltage of an access line of the plurality of access lines before transmission to an intersection of the intersections, wherein the biasing circuitry is configured to lower a ramp rate of the voltage biasing before the voltage bias is supplied to a corresponding intersection via the respective access line and wherein the biasing circuitry is configured to lower the ramp rate by tuning the ramp rate based on a distance of the intersection from the corresponding driver of the plurality of drivers.

2. The device of claim 1, wherein the access lines comprise bitlines and wordlines, and the access line comprises a bitline or a wordline.

3. The device of claim 1, wherein the biasing circuitry comprises a bias transistor configured to control whether biasing is applied to the access line.

4. The device of claim 3, wherein a ramp signal connected to a gate of the bias transistor at least partially determines a waveshape of the voltage biasing of the respective access line.

5. The device of claim 4, wherein the biasing circuitry comprises a variable current source coupled to the ramp signal.

6. The device of claim 5, comprising a control circuit that is configured to set the variable current of the variable current source using a trim signal based at least in part on a location of a respective memory cell of the plurality of memory cells.

7. The device of claim 5, wherein the biasing circuitry comprises a transistor configured to selectively couple and decouple the variable current source from the ramp signal.

8. The device of claim 5, wherein the biasing circuitry comprises a voltage supply coupled to the variable current source on an opposite side of the variable current source from the ramp signal.

9. The device of claim 5, wherein the biasing circuitry comprises a variable capacitor.

10. The device of claim 9, wherein the variable capacitor is coupled between ground and the ramp signal.

11. The device of claim 10, comprising a control circuit that is configured to control the ramp rate by changing capacitance of the variable capacitor using a trim signal.

12. A method, comprising:
receiving a first indication, at one or more biasing circuits, that a first memory cell is to be activated;
biasing, using the one or more biasing circuits, a first voltage using a first ramp rate;
activating the first memory cell using the first voltage;
receiving a second indication, at the one or more biasing circuits, that a second memory cell is to be activated;
biasing, using the one or more biasing circuits, a second voltage using a second ramp rate, wherein the second ramp rate is different from the first ramp rate, and the first and second ramp rates are based at least in part on respective distances of the first and second memory cells from respective decoders; and
activating the second memory cell using the second voltage.

13. The method of claim 12, wherein the first and second memory cells share at least one decoder and an access line coupled to the at least one decoder.

14. The method of claim 13, wherein the first ramp rate comprises a smaller slope than the second ramp rate, and the first memory cell is closer to the at least one decoder than the second memory cell is to the at least one decoder.

15. The method of claim 12, comprising:
receiving a third indication at an additional biasing circuit that the first memory cell is to be activated; and
biasing, using the additional biasing circuit, a third voltage using a third ramp rate, wherein the third ramp rate is in a different direction than the first ramp rate, and wherein activating the first memory cell using the first voltage includes using the third voltage.

16. The method of claim 15, wherein the first and third ramp rates have the same magnitude but different directions.

17. A memory device, comprising:
a plurality of access lines arranged in an array to form a plurality of intersections;
a plurality of memory cells located at intersections of the plurality of access lines;
a plurality of decoders configured to drive the plurality of memory cells via the plurality of access lines;
variable biasing circuitry configured to bias a voltage on an access line of the plurality of access lines to change a variable ramp rate of the voltage on the access line; and
a control circuit configured to:
determine a memory cell of the plurality of memory cells to be activated; and
based at least in part on a distance from the memory cell to a corresponding decoder of the plurality of decoders, set the variable ramp rate of the biasing circuitry.

18. The memory device of claim 17, wherein setting the variable ramp rate comprises:
adjusting a current of a variable current source by transmitting a trim current input from the control circuit to the variable current source;
adjusting a capacitance of a variable capacitor by transmitting a trim capacitance input from the control circuit to the variable current source; or
setting a width of an enable signal applied to a gate of a transistor coupled to the variable current source.

19. The memory device of claim 17, comprising a snap detector configured to detect when the memory cell is activated, wherein the control circuit is configured to clamp the voltage using the biasing circuitry in response to the activation of the memory cell.

\* \* \* \* \*